(12) United States Patent
Bird et al.

(10) Patent No.: US 7,202,649 B2
(45) Date of Patent: Apr. 10, 2007

(54) HIGH FREQUENCY SWITCH CIRCUIT

(75) Inventors: Ross W. Bird, Canton, PA (US); William C. Knoll, Turbotville, PA (US); John M. Staron, Montoursville, PA (US)

(73) Assignee: QorTek, Inc., Williamsport, PA (US)

( * ) Notice: Subject to any disclaimer, the term of this patent is extended or adjusted under 35 U.S.C. 154(b) by 54 days.

(21) Appl. No.: 11/201,567

(22) Filed: Aug. 11, 2005

(65) Prior Publication Data

US 2006/0044856 A1    Mar. 2, 2006

Related U.S. Application Data

(60) Provisional application No. 60/604,194, filed on Aug. 25, 2004.

(51) Int. Cl.
*G05F 1/56* (2006.01)

(52) U.S. Cl. .................. 323/282; 323/290; 363/16; 363/98

(58) Field of Classification Search ........ 323/282–290; 363/95, 97, 98, 16, 132
See application file for complete search history.

(56) References Cited

U.S. PATENT DOCUMENTS

| | | | |
|---|---|---|---|
| 4,720,668 A | | 1/1988 | Lee et al. |
| 5,019,770 A | * | 5/1991 | Harada et al. ............... 323/282 |
| 5,107,151 A | * | 4/1992 | Cambier ..................... 327/432 |
| 5,479,337 A | | 12/1995 | Voigt |
| 5,963,086 A | | 10/1999 | Hall |
| 6,021,053 A | | 2/2000 | Baskette et al. |
| 6,304,137 B1 | | 10/2001 | Pullen et al. |

* cited by examiner

*Primary Examiner*—Rajnikant B. Patel
(74) *Attorney, Agent, or Firm*—Michael Crilly, Esq.

(57) ABSTRACT

A high-frequency switch circuit is presented. The invention includes a pair of switches, a pair of inductors, and a pair of diodes. Inductors are electrically connected in series between the switches which are thereafter electrically coupled to a power source. Switches are electrically connected to gate drivers so as to control and coordinate the cycling of switches between ON and OFF states. Inductors are also electrically connected to an output thereby communicating a voltage waveform thereto. In some embodiments, it may be desired to electrically connect the inductors to an output circuit to further modify the waveform. Diodes are likewise electrically connected about the switches and inductors. The present invention is applicable to a variety of circuits having a totem pole arrangement of switches sequentially cycled ON and OFF, examples including but not limited to half-bridge, full-bridge, and hybrid configurations.

3 Claims, 3 Drawing Sheets

HIGH FREQUENCY SWITCH CIRCUIT

CROSS REFERENCE TO RELATED APPLICATIONS

This application is based upon and claims priority under 35 U.S.C. § 119(e) from U.S. Provisional Application No. 60/604,194 filed Aug. 25, 2004, entitled Isolation Device Technology, the contents of which are hereby incorporated by reference.

FEDERALLY SPONSORED RESEARCH AND DEVELOPMENT

None.

BACKGROUND OF THE INVENTION

1. Field of the Invention

The present invention generally relates to a circuit capable of improving the performance of a switch mode power supply and amplifier circuit. Specifically, the present invention is a circuit having inductors and diodes disposed between a pair of switches so as to minimize voltage and current transients and maximize efficiency.

2. Description of the Related Art

Dual switch circuits facilitate the sequenced cycling of switches between ON and OFF states to generate a voltage waveform having a square wave pattern. The square wave may be pulse width modulated and filtered to produce a desired waveform.

A common problem inherent to dual switch circuits is that individual switches impede one another, thereby wasting power and producing noise.

For example, FIG. 1 shows a totem pole circuit 1 comprising two electrically connected switches Q1, Q2, examples including FETs, IGBTs, BJTs, HBTs and other semiconductor devices, attached to a voltage source +HV and terminated to ground G2. The totem pole circuit 1 is electrically connected to an exemplary output circuit 3, including an inductor L3, capacitor C1 and ground G1. Operation of the circuit includes switch Q1 being ON when switch Q2 is OFF and switch Q2 being ON when switch Q1 is OFF. As such, the ON state switch Q1 or Q2 must charge the parasitic capacitance of the opposing OFF state switch Q2 or Q1, respectively. Parasitic capacitance is quite high at low voltage states. High transient currents are created through the switches Q1 and Q2, when one is ON and charging the capacitance of the other.

In another example, FIG. 2 shows the addition of two inductors L1 and L2 forming an isolation circuit 4 between switches Q1 and Q2. The isolation circuit 4 dissipates current transients; however, the added inductance causes voltage transients each time switch Q1 or Q2 is turned OFF.

What is required is a circuit capable of sufficiently absorbing transients associated with the function of a switch mode power supply and amplifier circuit, so as to achieve efficient voltage switching and to minimize noise.

SUMMARY OF INVENTION

An object of the present invention is to provide a circuit that minimizes voltage transients during the cycling of a switch mode power supply and amplifier circuit.

The present invention includes a pair of switches, a pair of inductors, and a pair of diodes electrically coupled to form a switch circuit with high frequency performance. Inductors are electrically connected in series between the switches which are thereafter electrically coupled to a power source. Switches are electrically connected to gate drivers so as to control and coordinate the cycling of switches between ON and OFF states. Inductors disconnect the capacitance of one switch from that of the other switch. Inductors are also electrically connected to an output thereby communicating a voltage waveform thereto. In some embodiments, it may be desired to electrically connect the inductors to an output circuit to further modify the waveform at the output. Diodes are likewise electrically connected about the switches and inductors so as to prevent over driving of the switches by the inductors.

The described invention has several advantages. The present invention minimizes transients and noise. The present invention improves circuit reliability and efficiency. The present invention allows each device to switch at its own rate without being affected by the other device. The present invention allows higher switching frequencies with minimal totem pole interactions and lower switching stresses. The present invention facilitates switching rates as high as 500 kHz.

REFERENCE NUMERALS

1 Totem pole circuit
2 Suppression-isolation circuit
3 Output circuit
4 Isolation circuit
5 Output
Q1 Switch
Q2 Switch
D1 Fly-back suppression diode
D2 Fly-back suppression diode
L1 Inductor
L2 Inductor
L3 Inductor
S1 Switch
S2 Switch
C1 Capacitor
G1 Ground
G2 Ground
GD1 Gate driver
GD2 Gate driver
+HV Voltage source
−HV Voltage source

DETAILED DESCRIPTION OF THE INVENTION

Figure 1:
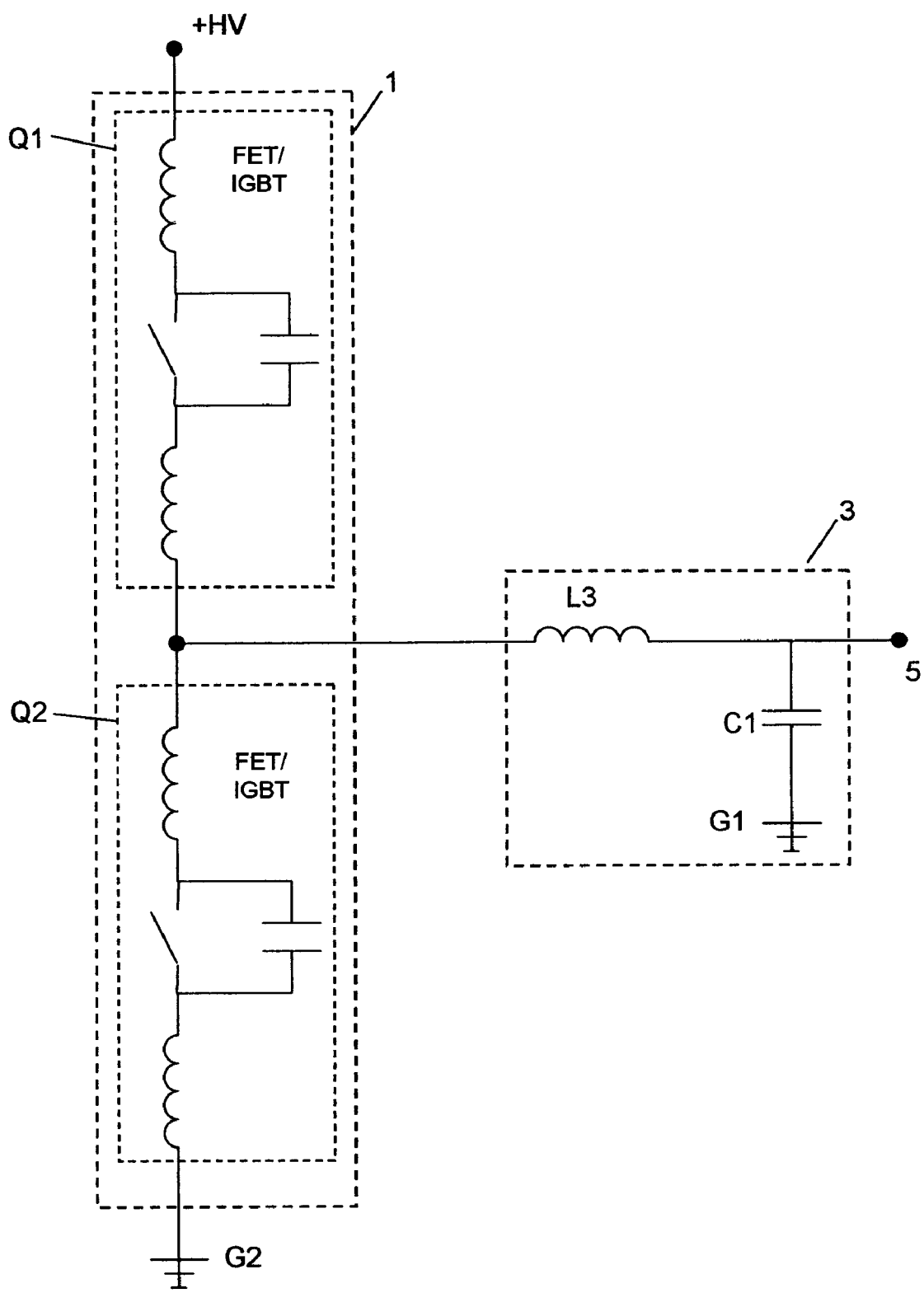
FIG. 1 shows a totem pole circuit electrically connected to an exemplary output circuit.
Figure 2:
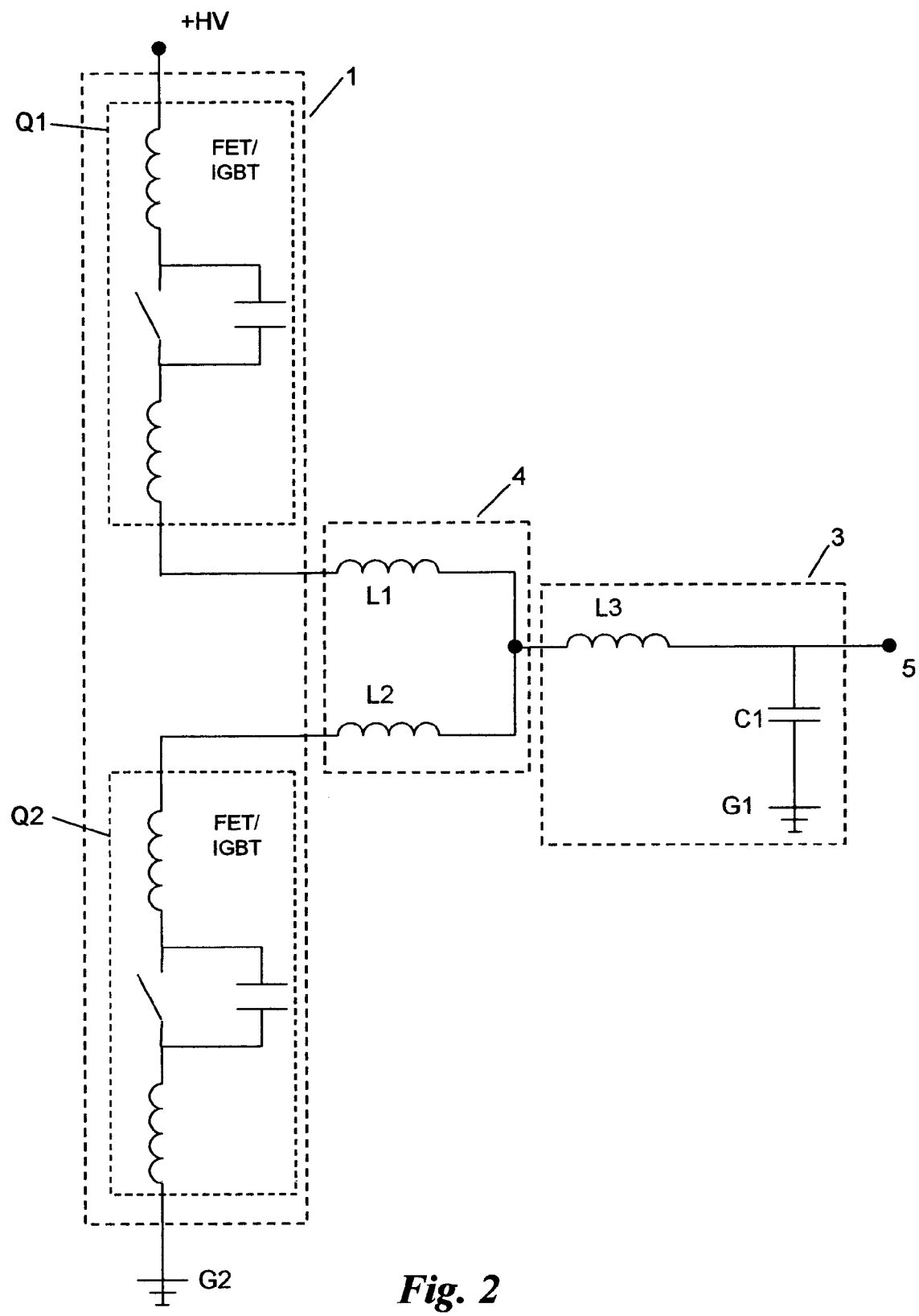
FIG. 2 shows a totem pole circuit electrically connected to exemplary isolation and output circuits.
Figure 3:
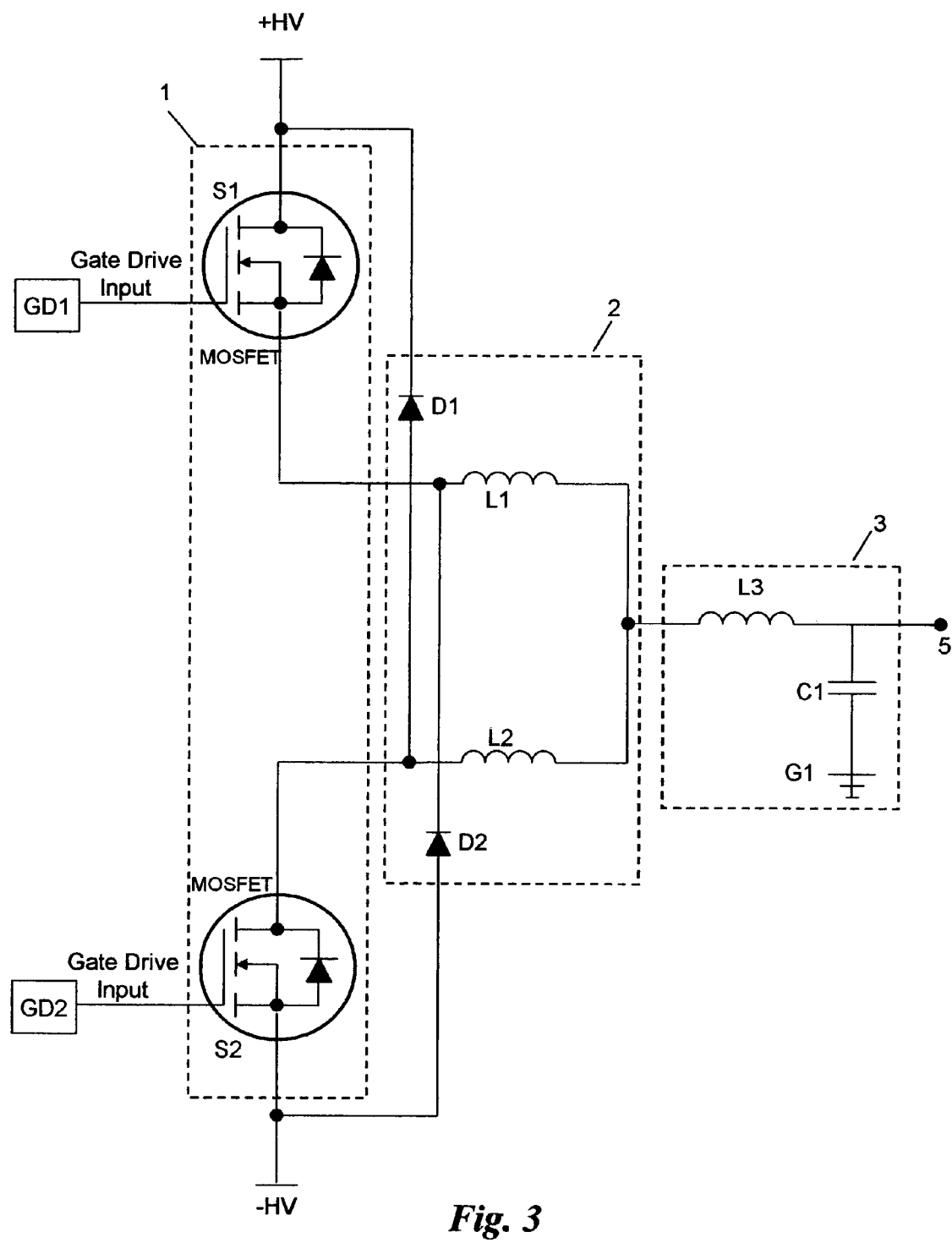
FIG. 3 shows an embodiment of the present invention including a totem pole circuit electrically connected to a suppression-isolation circuit and thereafter to an exemplary output circuit.

Referring now to FIG. 3, the present invention is generally comprised of a totem pole circuit 1 electrically connected to a suppression-isolation circuit 2 and thereafter electrically connected to an output circuit 3.

The totem pole circuit 1 includes a pair of switches S1, S2 coupled in a serial arrangement. Switches S1, S2 are thereafter electrically connected across a high-voltage source +HV and −HV. Exemplary switches S1, S2 include commercially available FETs, IGBTs, BJTs, HBTs, and other semiconductor type devices.

A MOSFET device with embedded diode is shown in FIG. 3 for both switches S1, S2. Switches S1, S2 are electrically controlled via one or more commercially available gate drivers GD1, GD2. Gate drivers GD1, GD2 communicate an input signal to each switch S1, S2 to control ON and OFF functionality.

The isolation circuit 2 includes a pair of isolation inductors L1, L2 and a pair of secondary fly-back suppression diodes D1, D2.

Inductors L1, L2 are coupled in series between and to the switches S1, S2. Isolation inductors L1, L2 disconnect the capacitance of one switch S1 or S2 from the other. During operation of the circuit, the load is also disconnection for a short time allowing a full switch before load current.

Inductors L1, L2 are chosen so as to not effect the normal operation of the output stage. Inductors L1, L2 are preferred to be of equal inductance, to have a smaller inductance than the inductor L3 in the output circuit 3, and to have a current rating at least as great as the current rating of the components in the output circuit 3. As a general rule, the value of the inductors L1, L2 is inversely proportion to the cycle rate of the switches S1, S2. For example, the half-bridge circuit shown in FIG. 3 having a power rating of 1 to 2,000 Watts would require a pair of inductors L1, L2 with a value from 0.25 µH to 10 µH.

Fly-back suppression diodes D1, D2 are electrically connected at one end between switches S1 and S2 and at a second end between the switches S1, S2 and high voltage source +HV and −HV. As shown in FIG. 3, the first diode D1 is electrically connected at one end to the electrical connection between the high voltage source +HV and switch S1 and at the opposite end to the electrical connection between the second inductor L2 and second switch S2. Also shown in FIG. 3, the second diode D2 is electrically connected at one end to the electrical connection between the high voltage source −HV and switch S2 and at the opposite end to the electrical connection between the first inductor L1 and first switch S1.

Fly-back suppression diodes D1 and D2 prevent the switches S1, S2 from being driven over voltage by the inductors L1, L2. Inductors L1, L2 absorb transients between the switches S1, S2. However, inductors L1, L2 impose an inductance causing additional voltage transients when either switch S1 or switch S2 is turned OFF. The secondary fly-back suppression diodes D1, D2 clamp voltage transients, so as to prevent damage to the switches S1, S2. As such, the breakdown voltage of the fly-back suppression diodes D1, D2 should be at least as great as the corresponding value of the switches S1, S2. Operational and safety considerations prefer for the secondary fly-back suppression diodes D1, D2 and switches S1, S2 to have an equivalent breakdown voltage.

The output circuit 3 modifies and filters the voltage waveform produced by the totem pole circuit 1 and suppression-isolation circuit 2 prior to the output 5. Referring again to FIG. 3, the output circuit 3 is shown electrically connected at one end to the suppression-isolation circuit 2 and at the other end to the output 5.

While a variety of output circuits 3 are possible, an exemplary output circuit 3 includes an inductor L3 having one end electrically connected between inductors L1 and L2 and the other end electrically connected to the output 5. A capacitor C1 is electrically connected at one end between the inductor L3 and output 5 and at the opposite end to a ground G1.

The present invention shown in FIG. 3 may be fabricated from a variety of commercially available devices. TABLE 1 summarizes exemplary components for one possible embodiment of the present invention.

TABLE 1

| Component | Manufacturer | Model No. | Description |
|---|---|---|---|
| Gate driver (GD1, GD2) | IXYS | IXDD408SI | MOSFET Driver |
| Switch (S1, S2) | IXYS | IXTP3N120 | 1200 V, 3 A MOSFET |
| Inductor (L1, L2) | Custom | | 0.5 uH, 3 A |
| Inductor (L3) | Custom | | 300 uH, 3 A |
| Diode (D1, D2) | STMicroelectronics | STTA512F | 1200 V, 4 A |
| Capacitor (C1) | Panasonic-ECG | ECW-H121035L | 1250 V Polypropylene |
| Source (+HV, −HV) | | | +/−500 Vdc |

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

What is claimed is:

1. A high frequency switch circuit comprising:
   (a) a pair of semiconductor switches electrically connected to a voltage source, said switches connected to at least one gate driver;
   (b) a pair of inductors electrically connected in series between said switches to disconnect capacitance of one said switch from another said switch, said inductors electrically connected to an output to communicate a voltage waveform thereto, said inductors having equal inductance which is inversely proportional to the cycle rate of said semiconductor switches;
   (c) a pair of diodes electrically connected about said switches and said isolation inductors to prevent said switches from being over driven by said inductors, said diodes have a breakdown voltage at least as great as said switches; and
   (d) an output circuit electrically connected between said isolation inductors and said output, said output circuit comprises:
      (i) a third inductor electrically connected in series between said isolation inductors and to said output; and
      (ii) a capacitor electrically connected at a first end between said third inductor and said output and at a second end to a ground, said pair of inductors having less inductance than said third inductor and current rating at least as great as that of said third inductor and said capacitor.

2. The high frequency switch circuit of claim 1, wherein said semiconductor switches are a MOSFET, a FET, an IGBT, a BJT, or a HBT.

3. The high frequency switch circuit of claim 1, wherein said diodes have a breakdown voltage equal to that of said semiconductor switches.

* * * * *